United States Patent [19]

Chaudhari et al.

[11] 3,949,387

[45] Apr. 6, 1976

[54] BEAM ADDRESSABLE FILM USING AMORPHOUS MAGNETIC MATERIAL

[75] Inventors: Praveen Chaudhari, Briarcliff Manor; Jerome J. Cuomo, Bronx; Richard J. Gambino; Thomas R. McGuire, both of Yorktown Heights, all of N.Y.

[73] Assignee: International Business Machines Corporation, Armonk, N.Y.

[22] Filed: Aug. 29, 1972

[21] Appl. No.: 284,512

[52] U.S. Cl. .................. 340/174 YC; 340/174 TF
[51] Int. Cl.² ................. G11C 11/14; G11C 13/06
[58] Field of Search ............ 340/174 TF, 174 YC

[56] References Cited
UNITED STATES PATENTS

| | | | |
|---|---|---|---|
| 3,624,622 | 11/1971 | Chen | 340/174 YC |
| 3,736,579 | 5/1973 | Marsh | 340/174 TF |

OTHER PUBLICATIONS

Journal of Applied Physics Vol. 42 No. 1 Jan. 1971 pp. 367–375.
Journal of Applied Physics Vol. 38 No. 10 Sept. 1967 pp. 4096–4097.
IEEE Transactions on Magnetics Vol. Mag–8, No. 1 Mar. 1972 pp. 105–130.

*Primary Examiner*—James W. Moffitt
*Attorney, Agent, or Firm*—Jackson E. Stanland

[57] ABSTRACT

A beam addressable file using as a storage medium an amorphous magnetic composition having uniaxial anisotropy. The storage medium can be prepared in thin film or bulk form or as particles in a binder. The storage medium can be comprised of a single element or a multicomponent system where at least one of the components has an unpaired spin so that the composition has a net magnetic moment. The storage composition exists in a microcrystalline structure (i.e., it has localized atomic ordering over a distance 25–100 angstroms) and also in a substantially amorphous structure (i.e., when the composition has localized atomic ordering only over distances less than 25 angstroms). Binary and ternary compositions, either alloys or compounds, are suitable. particularly good examples are combinations of rare earth elements and transition metal elements. The magnetic properties of these amorphous magnetic compositions are easily changed during fabrication or after fabrication, and the compositions can be doped readily without adversely affecting magnetic properties. Either electron beams or light beams can be used to write information into the storage medium and optical readout is generally preferred. Curie point writing or compensation point writing is used.

39 Claims, 3 Drawing Figures

U.S. Patent   April 6, 1976   3,949,387
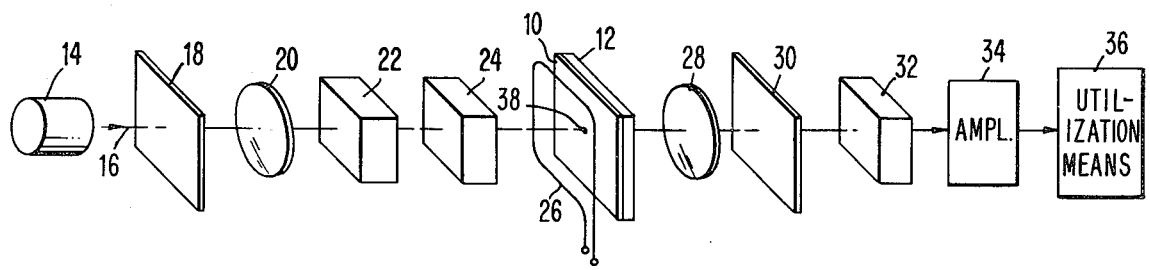
FIG. 1
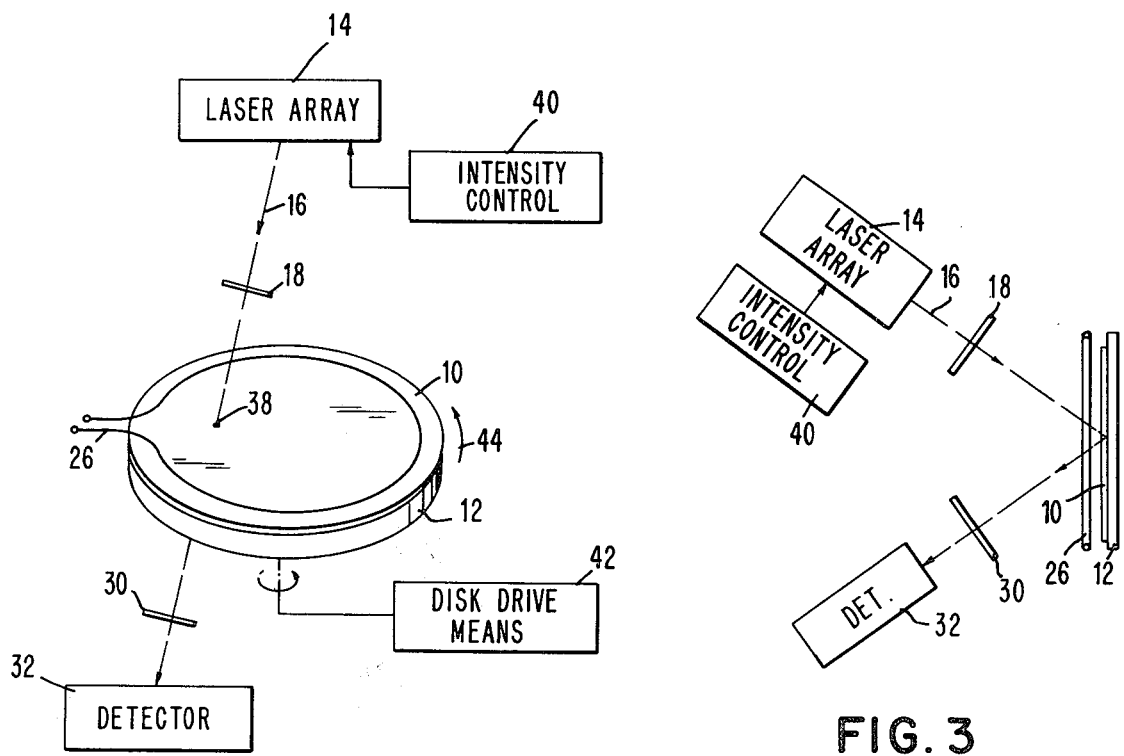
FIG. 2
FIG. 3

BEAM ADDRESSABLE FILM USING AMORPHOUS MAGNETIC MATERIAL

CROSS REFERENCE TO RELATED APPLICATION

Ser. No. 284,513 now abandoned filed the same day as the present application and assigned to the present assignee describes apparatus using amorphous magnetic materials.

BACKGROUND OF THE INVENTION

1. Field of the Invention

This invention relates to beam addressable files and more particularly to a beam addressable file in which an amorphous magnetic composition having uniaxial anisotropy is used as the storage medium.

2. Description of the Prior Art

Beam addressable files using thin maagnetic films of insulators are known in the art. For instance, materials such as gadolinium iron garnets have been used. Also, metals such as MnBi have been used as the storage medium in beam addressable files. General descriptions of these file systems can be found in the following references:

1. A. H. Eschenfelder, J. APPL. PHYS., 41, 1372 (1970).
2. J. A. Rajchman, J. APPL. PHYS., 41, 1376 (1970).
3. R. E. McDonald et al, J. APPL. PHYS., 40, 1429 (1969).
4. D. Chen et al, J. APPL. PHYS., 39, 3916 (1968).

In addition to these materials, stoichiometric MnAlGe has been suggested as a suitable material in a magneto-optic environment. This is a polycrystalline film, as are generally the magnetic films used for beam addressable file applications.

Some non-magnetic amorphous materials have been used in beam addressable file environments, as can be seen by referring to U.S. Pat. No. 3,530,441. These amorphous materials are "ovonic-type" materials which do not exhibit magnetic properties. They undergo structural changes when being switched in the beam addressable environment in contrast with the switching which occurs in a magnetic film. Because structural changes (transitions between an amorphous and a crystalline state) are much more destructive on the film itself, magnetic films can be switched many more times than presently used non-magnetic amorphous films in this type of environment.

Amorphous films have an advantage in that they can be placed on any type of substrate and can be adjusted to provide wide composition ranges. Additionally, the requirements relating to polycrystalline grain size which are present with crystalline beam addressable storage material are not present here.

It is desirable to provide an amorphous material which is suitable in a beam addressable file environment but which does not store information by a structural change in the physical properties of the material. Additionally, it is desirable to provide a magnetic storage medium in which domain size can be regulated and in which switching between various magnetization states is reversibly achievable over a great number of cycles.

Accordingly, it is a primary object of this invention to provide a beam addressable file having an amorphous magnetic film as the storage medium.

It is another object of this invention to provide a beam addressable file having as a storage medium a material whose magnetic properties can be easily changed over wide ranges.

It is still another object of this invention to provide an improved beam addressable file using a magnetic storage medium whose composition can be readily varied.

It is a further object of this invention to provide a beam addressable file using a magnetic storage medium which can be placed on any type of substrate, including both insulating and conducting substrates.

BRIEF SUMMARY OF THE INVENTION

A beam addressable file system is provided having a storage medium comprised of a magnetic amorphous film exhibiting non-magneto-crystalline uniaxial anisotropy. This anisotropy can be in the plane of the magnetic film or perpendicular to the magnetic film. For use in beam addressable files a perpendicular uniaxial anisotropy is desired.

The storage medium is comprised of a single element or is a multi-component system where at least one of the components has an unpaired magnetic spin. Thus, the compositions have a net magnetic moment and are magnetically ordered materials over a long range.

These amorphous compositions exist in a microcrystalline region where atomic ordering, if present exists over the range 25–100 angstroms. Additionally, substantially amorphous materials of the present invention exist having a structure where whatever atomic order is present is present over distances less than 25 angstroms.

Binary and ternary compositions are particularly suitable for the practice of this invention. These include both compounds and alloys, a suitable example being a rare earth — transition metal composition. For instance, Tb-Co and Gd-Co alloys are very suitable. In addition, doped rare earth — cobalt and rare earth — iron alloys are suitable (dopants are O, N, or C). Additionally, $HoFe_3$ is very suitable due to its low compensation temperature. Another suitable material is Dy-Co alloys, since these have low $4\pi M_s$ at room temperature. The magnetic properties of these substantially amorphous compostions can be changed during fabrication by altering the fabrication process or the compositional range of the constituents. Additionally, the magnetic properties of these compositions can be changed after fabrication and the films can be readily doped without adversely affecting magnetic properties.

Associated with the storage medium is a writing means generally comprising a light source, a polarizer, and light deflection means for impinging the light beam on any location of the storage medium. If desired, a single light beam can be provided or an array of light beams can be provided using a plurality of light sources. In particular, lasers provide suitable light beams of small diameter for high resolution. GaAs lasers formed individually or in an array are especially suitable.

The writing means further comprises a means for obtaining a magnetic field coupling the storage medium either at desired locations or throughout the storage medium. The means for producing this magnetic field can be a plurality of small current carrying coils or a large current carrying coil which produces a magnetic field in the entire storage medium. In addition, small needles of permanent magnet material adjacent the storage medium can be used. These means are all well known in the art.

Also associated with the storage medium is a reading means generally comprising an analyzer and a detector responsive to the intensity of light after its passage through the storage medium and the analyzer. The Kerr effect or Faraday effect can be used for reading information at desired locations of the storage medium. That is, a beam of light having a certain polarization will have its polarization affected depending upon the magnetization of the storage medium at the spot where the light beam strikes the storage medium. Depending upon the rotation of polarization of the light beam by the storage medium, it will either be blocked or will pass through the analyzer, depending upon the information state of the storage medium. The intensity of the light received at the detector will be a direct indication of that information state.

The amorphous compositions of the present invention are particularly suitable for beam addressable files since they have room temperature stability and are stable over wide temperature ranges. Additionally, these films have a relatively low Curie point which is controllable as desired. They are particularly easy to manufacture on any substrate and have coercivities which can be suitable adjusted.

The foregoing and other objects, features, and advantages of the invention will be apparent from the following more particular description of preferred embodiments of the invention, as illustrated in the accompanying drawings.

BRIEF DESCRIPTION OF THE DRAWINGS

FIG. 1 shows a beam addressable file system employing an amorphous magnetic film as the storage medium.

FIG. 2 shows a beam addressable file system in which the amorphous magnetic material is located on a movable disk.

FIG. 3 shows an apparatus for readout of the information stored in the amorphous magnetic film using the Kerr effect.

DETAILED DESCRIPTION OF THE PREFERRED EMBODIMENTS

FIG. 1 shows a beam addressable file system in which a film 10 of amorphous magnetic material is located on a suitable substrate 12. Substrate 12 can be an insulator or a conducting material and can be either transparent or reflecting to input electromagnetic energy. Examples of suitable substrates include glass, spinel, quartz, sapphire, $Al_2O_3$, and metals such as aluminum, copper, etc. An energy source 14 is provided which is usually a light source. Preferably source 14 is a laser on an array of lasers which produce a monochromatic output beam 16. This invention can utilize any electromagnetic or other energy source which can provide energy of sufficient intensity to heat the amorphous magnetic film 10 to a temperature approximating either its compensation temperature or its Curie point $T_c$. Thus, an electron beam can be used to locally heat portions of film 10 during the write and erase operations.

Associated with electromagnetic source 14 is a polarizer 18 and a focussing lens 20. Polarizer 18 is of a type well known in the art for providing a plane polarized beam.

A light modulator 22 is provided for varying the intensity of light beam 16. This feature is used for reading of information from selected portions of film 10, as will be more apparent later. A light deflector 24 deflects light beam 16 so that it will strike discrete selected portions of film 10. Light deflector 14 can be of a known type, for instance, an electro-optic deflector which deflects beam 16 to selected portions of film 10 in response to application of an electric field to deflector 14. An acoustic deflector is also suitable. Of course, in the case of an electron beam input, magnetic elements or electrostatic deflection elements are used to deflect the electron beam to selected portions of film 10.

Associated with film 10 is a current carrying coil 26 which is used to provide a magnetic field in film 10. This magnetic field is used for writing information into film 10 and will be explained more fully during the discussion of the write, read, and erase operations.

A lens 28 is used to slightly focus the beam 16 which has passed through film 10 and transparent substrate 12. An analyzer 30 selectively passes light beam 16, depending upon the degree of rotation of its polarization vector. Detector 32 is responsive to the intensity of the light beam incident upon it and provides an electrical signal in a manner well known in the art.

For instance, detector 32 can be a photocell, photodiode, or any other light sensitive element which produces an electrical output. Generally, detector 32 is a high frequency responsive photodetector.

The electrical output of detector 32 is amplified by amplifier 34 and applied to a utilization means 36, which can be any other circuit or apparatus responsive to the information state of the beam addressable file system.

The following discussion will concern compositional and magnetic properties of the amorphous magnetic medium 10. As has been noted, a greater amount of detail can be found in aforementioned copending application Ser. No. 284,513.

AMORPHOUS MAGNETIC COMPOSITIONS

Substantially amorphous magnetic compositions exhibiting uniaxial anisotropy have been produced which are useful in many magnetic applications. These compositions can be produced in bulk or thin film form, or can be present as magnetic particles in a supporting binder. Since they are amorphous materials, the choice of substrate makes no difference, and factors such as lattice matching can be ignored. This leads to ease of deposition onto substrates of any type and greatly increases fabrication yields obtainable when materials of the present type are used.

These magnetic compositions can be comprised of a single element of a combination of elements present in a multi-component system. At least one of the components must have an unpaired electron spin so that the composition will have a net magnetic moment. That is, these are magnetically ordered (over a long range) materials.

These amorphous magnetic materials exhibit a uniaxial anisotropy which can be perpendicular or parallel to the plane of a film comprised of these amorphous magnetic compositions. The anisotropy arises from combinations of the following, or from any one of the following:

A. Pair ordering
B. Shape anisotropy
C. Stress induced anisotropy

In the present invention, it is not important that uniaxial anisotropy be provided in any particular way.

These three mechanisms for production of uniaxial anisotropy in the substantially amorphous films of the present invention are generally known in the art and will not be discussed in great detail here. It is only sufficient to note that pair ordering involves the combination of two atoms whose magnetization is paired to form a net magnetic dipole. The magnetic pairs are aligned in certain directions which give rise to the uniaxial anisotropy required for use in magnetic devices.

Shape anisotropy arises because of the geometry of the magnetic regions. For instance, an ordered cluster of atoms in a region of a substantially unordered material will have a magnetization directed along the long axis of the atom cluster, since this axis will be preferred for alignment of magnetic moments. Along the short axis of the region defined by the cluster of atoms, strong demagnetizing fields exist.

Further, compositional variations in the amorphous material will produce phase separations which will give rise to this type of anisotropy. Phase separation includes both the situation of differing compositional regions located adjacent to one another and the situation of adjacent regions of the same composition having different structural phases (i.e., one region is amorphous while the other is more crystalline). As an example of phase separation, a Gd-Co amorphous magnetic alloy can be comprised of localized regions which are Co rich and other localized regions which are Gd rich. If these two regions are adjacent, this phase separation will produce uniaxial anisotropy.

Stress induced anisotropy arises from differences in the lattice parameters of the substrate and localized regions in the amorphous film, or because of differences of the thermal coefficients of the amorphous film and its substrate. This type of stress can also be a contributing factor to uniaxial anisotropy in substantially amorphous films of the present invention.

Amorphous magnetic compositions of the present invention exhibit microcrystallinity and/or substantially amorphous structure. Both of these structures differ from polycrystalline and single crystalline structures known in the prior art for magnetic compositions. For instance, the amorphous materials of the present invention may exhibit localized atomic ordering. However, if this atomic ordering is present, it will exist over distances between 25 and 100A if the material is microcrystalline, or over distances less the 25A if the material is substantially amorphous. Of course, it is to be understood that there may be essentially no atomic ordering present in which case a substantially pure amorphous material will be provided.

Amorphous materials of the present invention can be comprised of single magnetic elements or multicomponent systems. Examples of the latter are binary and ternary alloys and compounds. Particularly suitable materials are compositions comprising rare earth elements and transition metal elements. Examples include Gd-Co, Gd-Fe, Y-Co, and La-Co, etc. These compositions can be adjusted over a wide range without the restrictions imposed by compound stoichiometry due to the phase diagrams of the constituents. Therefore, the magnetic properties of the materials can be tailored to whatever application is required. For instance, the composition ranges can be chosen such that the atomic moments of the rare earth element and the transition metal element nearly cancel, thereby obtaining a material with low saturation magnetization which would be of particular value as a bubble domain material.

These amorphous magnetic compositions exhibit long range magnetic ordering and have uniaxial anisotropy. In their simplest form, they are comprised of elements which in an elemental form carry a magnetic moment. Examples are the 4f series (rare earth elements) and the 5f series (the actinide elements). Also included are the iron group transition metals (3d series). Further included are elements which have a magnetic moment when in a particular state, exemplified by elements such as Mn, Cr, V, and Pd.

For any amorphous composition comprised of a single element, any non-magnetic element can be added to the composition in relatively small amounts without interfering with the magnetic properties. That is, dilution with non-magnetic elements (such as, O, C, P, and N) can be done without adversely affecting the magnetic properties. Therefore, it may be advantageous to add small amounts (generally, about 2 atomic percent) of these non-magnetic elements in order to make the amorphous film more easily. Of course, if large amounts are added, magnetic properties are affected. For instance, amounts greater than about 50 atomic percent will destroy long range magnetic ordering.

Binary compositions including at least one of the elements listed previously can also be used for the amorphous magnetic materials of the present invention. Binary compositions are generally easier to work with since they will retain their amorphous structure over wider temperature ranges than single element amorphous magnetic materials. As in the case of the single element amorphous material, small amounts of non-magnetic elements can be added to the composition.

Another change which can be made to binary amorphous compositions is to add a major concentration (2–50 atomic percent) of non-magnetic elements to change the magnetic properties. For instance, copper can be added to dilute the magnetic moment.

Ternary combinations of the aforementioned 3d, 4f and 5f elements can also be made to provide amorphous compositions having uniaxial magnetic anisotropy. As is the case with the binary elements, major concentrations of non-magnetic elements can be added to change magnetic properties of these ternary compositions. Also, small amounts of non-magnetic materials can be added to more easily form amorphous films, without adversely affecting the magnetic properties. It should be understood that the amount of non-magnetic materials added is not sufficient to lose the long-range magnetic ordering in the amorphous film.

The amorphous magnetic materials of the present invention have long-range magnetic ordering and are either ferromagnetic, ferrimagnetic, or antiferromagnetic. Of course, it is this long range magnetic ordering which yields the uniaxial anisotropy present in these materials, which in turn makes them very useful for device applications.

The magnetic properties of these compositions can be changed during fabrication or after fabrication to suit particular applications. It has been determined that the magnetic properties are very dependent on the composition range of the constituents and also on the deposition conditions used to provide the composition. However, the dependency of magnetic properties on the deposition parameters is less than the dependency on the compositional ranges of the constituents. Processes such as annealing and ion implantation can be utilized after fabrication of these amorphous compositions to modify magnetic properties. Additionally, these magnetic materials can be doped with impurities and the structural magnetic properties of the films will not be adversely affected. Therefore, magnetic domain movement in the films will not be affected as is the case with conventional crystalline magnetic films. Examples of specific suitable amorphous magnetic compositions for a variety of applications will be presented in the specification and tables of materials and their properties will be presented at the end of the specification.

Depending upon the exchange interactions present in these materials, it may be possible to provide insulators, conductors and semiconductors which are substantially amorphous. In metals and semiconductors, the exchange interaction can be either direct, due to overlap of the atomic orbitals, or indirect due to the conduction electrons. These exchange mechanisms are not heavily sensitive to the long-range atomic order of the system and are mechanisms which make amorphous materials suitable for magnetic applications. However, the exchange mechanism in insulators is generally super-exchange which is critically dependent on bond angle and distance. Since long-range atomic order is absent in amorphous materials, these super-exchange requirements cannot be satisfied and longrange magnetic order is not observed.

ADJUSTMENT OF MAGNETIC PROPERTIES

Depending upon the particular application in which these amorphous magnetic compositions are to be used, their magnetic properties are adjustable for optimum performance. Adjustment of magnetic properties in these amorphous materials is easily provided by techniques during fabrication of the amorphous materials and by processes utilized after the amorphous compositions are prepared. In contrast with prior art crystalline magnetic materials, the magnetic properties of amorphous films are generally easier to control than the corresponding properties in crystalline materials. One reason for this is that the compositional variations which are allowed in an amorphous material are far more extensive than the variations allowed in a crystalline material since amorphous compositions are governed by metastability, rather than by thermodynamic equilibrium. Various magnetic properties will now be individually discussed to illustrate the flexibility offered by amorphous materials.

SATURATION MAGNETIZATION $M_S$

Magnetization $M_S$ is easily altered in an amorphous magnetic material by the addition of a magnetic atom which couples with a normally magnetic atom in the amorphous material, or an atom in the amorphous material which is magnetic in some state (for instance, Mn, Cr, . . . etc). To lower the magnetization $M_S$, the material added to the amorphous composition couples antiferromagnetically with the magnetic atom in the amorphous material. For instance, to lower the magnetization of the Gd-Co amorphous alloy, the Gd/Co ratio is adjusted so that their magnetic moments more nearly cancel.

To increase the magnetization of the amorphous material, magnetic atoms are added to the composition which couple ferromagnetically to the magnetic atom in the amorphous composition. For instance, the addition of Nd to an amorphous composition of Gd-Co will increase the magnetization of the composition. As another example, the addition of Co to an amorphous composition of Y-Co will increase the magnetization.

These additions are added during the fabrication process and are done in the following way: A mixture of the constituent elements is melted and cast into a disc shaped ingot which is used as a target for sputtering. The composition can be adjusted during the target fabrication or the composition of the film can be varied during the sputtering process by adjusting the bias voltage on the substrate in order to preferentially re-sputter a fraction of one or more of the constituents. Alternatively, a second target of the additive element can be provided in the sputtering system so that one of the additive elements is introduced into the deposited film.

When thin films are fabricated by vacuum evaporation, the concentration of the additive can be varied in the evaporation source or a supplemental source of the additive element can be provided.

The compostion region near the magnetization minimum is particularly suitable for low magnetic moment materials with high Curie points. Because the low magnetization of compositions near 79 atomic percent cobalt results from a cancellation of the Gd and Co moments rather than from dilution effects, the Curie point, which is largely determined by Co-Co interactions, is not affected. Consequently, the magnetization of the material at room temperature can be changed while still keeping $T_c$ within specified ranges.

Another way to change the magnetization of an amorphous alloy is by adding small amounts of $N_2$ when the amorphous alloy is being sputtered. For instance, when sputtering Gd $Co_5$ is argon, addition of small amounts of $N_2$ (approximately 1 volume percent $N_2$ in the argon gas) causes stripe domains in the material to decrease markedly in size. This in turn indicates an increase in $4\pi M_S$. That is, the antiferromagnetic coupling of the Gd and Co is affected such that the magnetization is increased without destroying the uniaxial anisotropy of the amorphous material. The nitrogen bonds with the Gd thereby weakening the antiferromagnetic coupling between the Gd and the Co. The moment of the Co sublattice is less effectively cancelled by that of the Gd sublattice so the magnetization increases.

COERCIVITY $H_c$

Coercivity in magnetic material is a primary factor in determining the ease with which magnetic domains move in the material. Adjustments to coercivities usually involve adjustments of the grain size of the magnetic material, since coercivity is dependent upon grain size. Generally, the coercivity is a maximum for some value of grain size and diminishes for grain sizes less than and greater than that which gives the highest coercivity. For instance, coercivity is high in magnetic materials in which the grain size approaches the domain wall width.

Grain size can be influenced by adding dopants such as $N_2$ and $O_2$. These additives change the ordering in the amorphous film so that it is different than (or the same as) the domain wall width ($\delta$). If $\delta >$ the ordering, $H_c$ is low while if $\delta \simeq$ the ordering $H_c$ is maximum.

Ion implantation to a selected depth is generally suitable, as it is not desirable to unduly heat amorphous materials. Heating beyond certain temperatures causes amorphous materials to change to a crystalline state, which may not be a reversible state. Annealing to crystallize the amorphous film to provide grains of the desired size can also be used.

Other methods for influencing coercivity involve surface treatment such as sputter etching and ion etching to roughen the structure of the surface. This in turn will influence the movement of domains in the amorphous magnetic material.

CURIE TEMPERATURE $T_c$

These amorphous magnetic materials are easily alloyed to change the Curie temperature without adversely influencing the structure of the materials. Additionally, there is no limitation imposed by a phase diagram as would be the case for crystalline material. Alloy ranges over large amounts (approximately 50 atomic percent) can be used as long as the uniaxial anisotropy of the material is not affected. Generally, the Curie temperature will scale linearly with the amount of magnetic atoms present. The Curie temperature in these amorphous materials is easier to control than in crystalline magnetic materials.

Alloying conditions are used to change the Curie temperature of the amorphous magnetic material. For instance, for a Gd-Co amorphous alloy, the addition of lower moment magnetic atoms such as Ni, Cr, Mn or non-magnetic atoms such as Cu, Al, Ag, Pd, Ga, In, etc. will lower the Curie temperature, while the addition of an element such as Fe will increase the Curie temperature. The strength of the magnetic interaction (coupling) in the material is changed by the added elements.

FARADAY ROTATION $\phi_F$

Increased Faraday rotation or Kerr rotation of a light beam incident upon the amorphous magnetic material is achieved by providing amorphous material having a high magnetic moment. Rare earth dopants, such as Tb, Dy, Ho can be added to the amorphous material, or alloying additions can be added to the material. For instance, in the case of the Gd-Co amorphous alloy, increasing the amount of Co will increase the Faraday rotation. Also, additions of Fe to the material will also increase the Faraday rotation. For high Faraday rotation, it is desirable that the magnetization $4\pi M_s$ have as high a value as possible (for instance, 8000 – 10,000 gauss).

DOMAIN WALL ENERGY $\sigma_w$

The domain wall energy $\sigma_w$ is related to the $l$ parameter of the amorphous material. The domain wall energy is also directly proportional to $\sqrt{AK_u}$, where A is the exchange constant of the material and $K_u$ is the uniaxial perpendicular anisotropy constant of the material.

The domain wall energy can also be changed by varying the exchange constant A or the anisotropy $K_u$. Exchange constant A represents the strength of the magnetic coupling in the material and is proportional to Curie temperature $T_c$. Consequently the constant A will change from one material to another. Changes in anisotropy are discussed in a later section of the specification.

ANISOTROPY $K_u$

The anisotropy of the material can be varied by varying the process used to make the amorphous composition. For instance, the deposition rate is a determining factor as is the thickness of the deposited film. In general, $K_u$ is function of the material composition and growth conditions. These factors will be discussed more fully in the section dealing with fabrication techniques.

DOMAIN SIZE AND DOMAIN WALL WIDTH $\delta$

The domain wall width is equal to $\sqrt{A/K_u}$ where A is the exchange constant of the material and $K_u$ is its anisotropy. As was mentioned previously, anisotropy $K_u$ depends upon the thickness of the amorphous film and upon the deposition rate. Therefore, domain wall width $\delta$ can be varied by changing anisotropy $K_u$. This in turn is a function of the composition of the amorphous film, its range of constituents, and the deposition process used to make the amorphous material. In the section on fabrication techniques, the variation of anisotropy $K_u$ with film thickness and deposition rate will be described.

The domain size is a function of the characteristic length $l$ and the thickness of the film. Generally, the domain size is chosen so that device performance is optimal. For magnetic bubble domain systems, the characteristic length $l$ is given by the following relationship.

$$l = \sigma_w/4\pi M_s^2$$

$$= \frac{\sqrt{AK_u}}{4\pi M_s^2}$$

Consequently, the characteristic length, and therefore the domain size, can be varied by varying magnetization $M_s$, anisotropy $K_u$, and exchange constant A.

The exchange constant is a quantity representing the strength of magnetic coupling within a given material. It is proportional to the Curie temperature and will be larger for materials which have larger Curie temperatures $T_c$. As explained previously, the anisotropy $K_u$ is a function of the material composition and growth conditions used to obtain the material. Magnetization $M_s$ results from magnetic spins and their alignment (either parallel or antiparallel). This quantity is temperature dependent and can be varied by varying the amorphous film composition and the growth parameters used for providing the amorphous film. Therefore, the domain size can be varied readily over wide ranges.

OPERATION OF THE SYSTEM OF FIG. 1

Information is written into storage film 10 using either Curie point writing or compensation point writing. Readout is achieved using either the Kerr or Faraday effect. Erasure in discrete locations or block erasure of the entire sheet 10 is easily obtained.

WRITE OPERATION

The steps required to produce information in selected regions of amorphous magnetic sheet 10 are the same whether Curie point writing or compensation point writing is used. For compensation point writing at room temperature, it is desirable that the compensation temperature be within 60°–100°C of room temperature. This insures that laser power will be kept low. Materials which have good values of $4\pi M_s$ at room temperature include Gd-Co, Tb-Co, and Dy-Co amorphous alloys. The concentration of the components in each of the magnetic sublattices of these alloys can be adjusted so that their magnetizations are approximately equal at room temperature. That is, the relative concentrations of Gd and Co in an alloy of these materials can be adjusted so that the magnetization associated with the Co sublattice is approximately equal in magnitude to that associated with the Gd sublattice. Coercivity $H_c$ is proportional to $2K_u/M_s$. Since $M_s$ goes to zero at the compensation temperature and $K_u$ is fixed, the coercivity $H_c$ increases rapidly at the compensation temperature. In order to insure that there is some coercivity left at the operating temperature (preferably room temperature), the operating temperature should be fairly close to the compensation point. The coercivity is important in beam addressable files since written data will remain in storage even in the presence of ambient magnetic fields if the coercivity of the medium is sufficient, as is well known in this art.

The write operation is as follows for both Curie point writing and compensation point writing:

1. The storage film 10 is initially in a demagnetized state having about equal numbers of magnetic domains with magnetization oppositely directed and perpendicular to the plane of the film. The storage film 10 is then subjected to a saturation magnetic bias field normal to the plane of the film in order to get the magnetization of all domains in one direction. This is easily achieved by passing a current through coil 26.

2. After this, a small magnetic bias field perpendicular to the plane of film 10 but oppositely directed to the saturation magnetic field is applied over the entire film. Again, this small magnetic field is conveniently applied by current through coil 26. If desired, the film can be scanned by a permanent magnet to provide the large saturation bias field.

3. The laser beam 16 is then directed to a selected location of film 10 where it causes localized heating of the film to a temperature above the compensation temperature (compensation point writing) or to a temperature approximating the Curie temperature $T_c$ (Curie point writing). The small magnetic field is still present in the magnetic film 10. When the laser pulse is removed the portion of film 10 on which the laser beam was incident cools in the presence of the small magnetic field and has its magnetization switched to that direction.

In some cases, the small magnetic field may not need to be present while the localized region of the film is cooling if sufficient magnetic closure paths exist in film 10 in order to achieve the reverse magnetization.

Both Curie point writing and compensation point writing are used to put localized regions of the film 10 into a reverse magnetization state. The advantage of compensation point writing is that the coercivity of the film is automatically of a correct value near the compensation point so that the film need not be initially tailored with respect to this parameter. Both of these types of writing are well known in the art.

READ OPERATION

Information contained in recorded spots (such as 38) of film 10 is conveniently read using either the magneto-optic Kerr effect or the Faraday effect. For this purpose, the same light beam 16 as was used for writing can be utilized. However, the intensity of the light beam is reduced to approximately 1/10 of its intensity when used for writing so that no appreciable temperature rise occurs when the storage medium 10 is exposed to the incident beam.

During the write operation, modulator 22 allowed beam 16 to proceed unimpeded to film spot 38. This in turn allowed rapid heating of the film to a temperature close to either a Curie point or compensation point. However, during the reading operation modulator 22 lessens the intensity of beam 16 reading spot 38, so that its intensity is approximately 1/10 of its intensity when used for writing.

When reading beam 16 is incident on a recorded spot 38, the plane of polarization of the transmitted light beam is rotated as a function of the orientation of the magnetic vector of the recorded spot. For purposes of this specification, it is assumed that analyzer 30 will pass the light beam when the polarization direction of the beam is rotated in a direction corresponding to an antiparallel magnetic vector alignment and will block the light beam when its polarization is rotated in a direction corresponding to a parallel magnetic vector alignment. Thus, the magnitude of the signal generated by detector 32 is indicative of the magnetization direction of the recorded spot 38 which is being read.

ERASURE

Erasure can be done either locally or over the entire storage medium 10. Local erasure results when discrete portions 38 of film 10 have new information written into these portions. Additionally, localized erasure is achieved when the laser beam 16 hits a localized spot which then cools in the presence of a small magnetic field in the direction of the initially applied saturation magnetic field. Thus, the operation is similar to a writing operation except that the small magnetic field insures that the localized spot returns to (or stays in) its initial direction of magnetization.

Block erasure is provided by providing a large magnetic bias field in the original saturation direction. The laser beam 16 is not required for block erasure.

FIG. 2

FIG. 2 shows an embodiment of a beam addressable file in which the storage film 10 is located on a disk shaped substrate 12. For ease of explanation, the same reference numerals will be used whenever possible. A laser array 14, or an individual laser is used to provide a light beam 16 for writing and reading information into selected portions 38 of amorphous magnetic film 10. As was shown in FIG. 1, a polarizer 18 produces a plane polarized beam of light while an analyzer 30 is used during the reading operation to either pass or block light of selected polarizations. Detector 32 is responsive to the light which strikes it and is used to provide an electrical signal of the information state of selected portion 38.

Associated with laser array 14 is an intensity control circuit 40, which is used to modulate the intensity of laser beam 16 or used in the writing and reading operation. Intensity control 40 can be, for instance, a circuit which reduces the bias current to injection lasers in the array, or a modulator which is located within the laser cavity itself. Disk drive means 42 is used to rotate the disk comprising film 10 and substrate 12 in the direction of arrow 44. Thus, selected portions of film 10 are addressed using a stationary laser or array of lasers to provide input beam 16. As was the case previously, source 14 can be another source of electromagnetic energy, such as an electron beam. Regardless of the writing source, a light source would generally be used for purposes of readout.

Operation of the embodiment of FIG. 2 is identical to that of FIG. 1, and will not be described further.

FIG. 3

FIG. 3 shows an embodiment for writing information into storage film 10 and for reading information from selected portions of this film using the Kerr effect, rather than the Faraday effect which has been illustrated with respect to the embodiments of FIGS. 1 and 2. In this embodiment, a source 14 of electromagnetic energy, generally a laser array, provides a beam 16 which passes through plane polarizing element 18 before striking storage medium 10. Substrate 12 is reflective to the beam 16 and the beam will be reflected from the substrate 12 through an analyzer 30 before striking detector 32. As was the case in FIG. 2, an intensity control circuit 40 is provided for varying the amplitude of beam 16.

Operation of the apparatus of FIG. 3 is the same as that for FIGS. 1 and 2. The only difference is that beam 16 is reflected from substrate 12 after passing through film 10, rather than being transmitted through substrate 12 before striking detector 32. This type of readout utilizes the Kerr effect and provides information in a manner entirely analogous to that when light beam 16 passes through substrate 12.

FABRICATION OF AMORPHOUS MAGNETIC MATERIALS

These materials can be fabricated in bulk form, or as thin films. In general, any known film deposition technique can be utilized including sputtering and evaporation.

To form a bulk film of amorphous magnetic material splat cooling may provide a useful technique. In this method, a hot liquid of the film constituents is incident on a cool surface where the constituents solidify to form an amorphous bulk film. This provides a rapid quenching from the liquid phase.

Uniaxial anisotropy can be induced in bulk films by subjecting them to bombardment by energetic atomic particles in an applied magnetic field or by annealing them in a magnetic field at a temperature below their crystallization temperature. Another method for providing bulk films is to continuously evaporate them, using the techniques described below.

Fabrication of thin amorphous film in accordance with the present invention can utilize deposition from a vapor, rapid quenching from a liquid phase, or ion implantation for adjustment of anisotropy. In general, these amorphous films are dependent upon the rate of deposition of atoms onto the substrate, the temperature of the substrate, and the angle of incidence of atoms depositing on the substrate. If the incoming atoms are not able to get into some equilibrium site, the tendency to form amorphous films will be increased. In this context, reference is made to S. Mader, *The Use of Thin Films in Physical Investigations*, edited by J. C. Anderson (Academic, New York, 1966) p. 433. Also, see U.S. Pat. No. 3,427,154 which discusses the fabrication of amorphous thin films.

In order to favor pair ordering as a means of obtaining uniaxial anisotropy in these films, it appears to be important that the depositing atoms strike the substrate at a non-normal angle of incidence. That is, the incoming atoms should have some component of velocity parallel to the substrate surface in order to achieve uniaxial anisotropy in the film. This "glancing angle" gives the atom mobility parallel to the substrate which in turn favors pair ordering, since the incoming atoms can move around and choose an atomic site which lowers the energy of the system through the demagnetizing fields of the material. Phase separation is favored which will lead to shape anisotropy because clusters of similar atoms will group together at a site in which the energy of the system is lowered. This in turn leads to compositional groupings which, as explained previously, will lead to anisotropy in the film.

Another factor in achieving uniaxial anisotropy is the deposition rate of incoming atoms. If the deposition rate is too high, incoming atoms cannot move around greatly on the substrate surface, thereby limiting mobility parallel to the substrate. In this regard, reference is made to aforementioned copending application Ser. No. 284,513 which discusses this more fully.

As the substrate bias used in the sputtering system increases, the anisotropy generally increases. This is because the bias causes incoming atoms to be loosened from the surface of the depositing film by resputtering. Consequently, the atoms have more mobility parallel to the substrate surface which enables them to achieve preferred sites leading to compositional grouping or pair ordering.

For the deposition of amorphous magnetic materials, the substrate temperature is kept relatively low. These films can be deposited at room temperature or less and generally are deposited at a temperature less than that which would cause crystallization of the materials. For instance, for Gd-Co amorphous materials an upper limit for substrate temperature is approximately 300°C, the crystallization temperature.

Amorphous magnetic films can be produced over a wide range of substrate temperatures depending upon the deposition rate. Generally, no matter what deposition rate is used, the substrate temperature must be less than that at which crystallization occurs in order to provide amorphous magnetic materials in accordance with the present invention.

Stress induced anisotropy can also be used to provide the subject amorphous magnetic materials. This type of anisotropy can be used together with the other methods (pair ordering, etc.) for obtaining anisotropy, or can be used by itself. For stress induced anisotropy, the substrate is chosen to couple to the magnetostriction of the deposited film such that anisotropy will be provided in the amorphous film. In more detail, if the film is deposited at some temperature other than room temperature and if the film and substrate have different coefficients of thermal expansion, the film will experience a net stress at room temperature.

As was mentioned previously, many substrates can be used. Since the restraints of crystallographic matching do not exist for the production of amorphous films, the choice of substrates is unlimited. These substrates can be any known materials including metals and insulators, as well as semiconductors. Non-rigid substrates, such as plastics, can also be used. In the TABLES to follow, numerous substrates will be mentioned.

Films which have in-plane anisotropy can be changed to films having perpendicular anisotropy by annealing the films. For instance, annealing Gd-Co films at about 300°–400°C will switch an in-plane anisotropy to a perpendicular anisotropy. Of course, as the film thickness increases, the likelihood of perpendicular anisotropy also increases. For instance, Gd-Co films of thickness at least 2000A generally exhibit perpendicular anisotropy.

EXAMPLES

Amorphous magnetic compositions having uniaxial anisotropy have been prepared using sputtering (DC and RF) and electron beam evaporation. In general, films have been produced having amorphous characteristics as determined by electron beam diffraction techniques, among other. Magnetic anisotropies have been produced which were parallel to the plane of the film and perpendicular to the plane of the film.

I. ELECTRON BEAM EVAPORATED FILMS

In this method of film preparation, a polycrystalline target is first prepared using conventional techniques. For instance, small pieces of the constituents to be used in the target are melted in an inert gas atmosphere, using for example argon. Melting occurs on a water cooled copper hearth in a standard commercial arc furnace. The temperature is raised to the melting temperature of the constituents to form an arc melted ingot. Generally this is a polycrystalline target. In the laboratory, samples have been prepared from targets of arc melted $GdCo_5$.

After this, the target is placed in an ultra-high vacuum evaporator having a base pressure approximately $10^{-9}$ Torr. The ingot is placed in a water cooled copper hearth and is heated by an electron beam provided from an electron gun in the evaporator. Accelerating voltages of approximately 10 KV are used together with beam currents of approximately 100 milliamps.

The substrates used to deposit these films are arbitrarily chosen, and substrates such as glass, polished fused quartz, rock salt, and sapphire have been used successfully. The substrates are cooled with liquid nitrogen and have a temperature of approximately 100°k during the evaporation. The deposition rate was generally about 30A per second.

In one example, films were produced having thicknesses of 400A and 4000A. These films were Gd-Co alloys which were shown to be amorphous by electron beam diffraction. The atoms of the depositing materials striking the substrate approached at a glancing angle (any non-90° angle to the substrate plane) in order to provide the uniaxial anisotropy previously discussed. Perpendicular domains are seen in this film.

In another film deposition, the substrate temperature was 273°K. The same substrates were used and additionally $BaTiO_3$ substrates and cleaved mica substrates were used. The target composition ($GdCo_5$) was the same as that used for the 400A and 4000A films of the previous paragraph. Only the substrate temperature was changed in this deposition. In this case the film had crystallites located in a generally amorphous matrix, which indicates that the substrate temperature is critical in an electron beam deposition fabrication process. To provide substantially amorphous films, the substrate temperature has to be lowered from 273°K.

In another electron beam deposition, the target was $GdCo_2$ and the substrate was liquid nitrogen cooled. The film produced was amorphous having a uniaxial magnetization in the plane of the film. It appeared that the magnetization $M_s$ of this composition was too high so that the ratio $H_{A/4} \pi m_s t_0$ was not precisely correct for support of domains having perpendicular magnetization.

II. SPUTTERED FILMS

Many amorphous films have been produced by DC and RF sputtering, at various values for the sputtering parameters. These films exhibited perpendicular magnetic anisotropy and parallel magnetic anisotropy and were uniaxial. Many values of magnetization and other magnetic parameters were obtained, in accordance with the principles outlined previously in the specification.

The following tables will describe the sputtering conditions and film data for various samples of amorphous magnetic films in accordance with the present invention. For the films produced from a target of $GdCo_5$, additional tables will be presented describing the actual sputtering process in more detail to more fully illustrate how to form these amorphous films. Since pre-sputtering steps and sputter cleaning steps are generally used before the actual deposition by sputtering, details concerning the sputtering process for the $GdCo_5$ target will sufficiently illustrate the principles involved for sputtering of films from other target compositions.

In these tables, DC sputtering was used if the "anode-cathode voltage" is a non-zero number. If this quantity is zero, RF sputtering was used. For RF sputtering, the power in watts and power density in watts/in.$^2$ is indicated, while for DC sputtering the current in ma. and the current density in ma./in.$^2$ is indicated.

Further, the DC sputtered samples have been metal coated on the back of the substrate for electrical contact during sputtering. Additionally, all substrates were gallium-backed to a water cooled or liquid $N_2$ cooled metal block. The liquid gallium interface between the substrate and the metal block provided uniform heat distribution.

In these sputtering processes, the anode-cathode spacing usually varied between about 1 inch and 1 ¼ inches, but can be varied from this as will be appreciated by one of skill in the art. The quantity "atomic ratio Co/Gd" was determined by any of the following methods: alpha particle back scattering, electron beam microprobe analysis, and X-ray fluorescent analysis.

In the tables for the details of the sputtering process pertaining to films produced from the $GdCo_5$ target, pre-sputtering and sputter cleaning steps are used before the actual sputter deposition. The pre-sputtering step is a getter cleaning of the system in which the target is cleaned. Sputtering occurs from the target and target atoms are deposited throughout the sputter apparatus. However, the substrates are covered by a shutter during this cleaning and the target atoms will not deposit on the substrate.

During the sputter cleaning step, the surface of the substrate is cleaned by sputtering between a shutter and the substrate, where the shutter is located in front of and blocks the target. The shutter has a ground potential while approximately 120 volts negative is placed on the substrate. This cleans the top surface of the substrate for subsequent deposition. During the actual sputter deposition, the shutters are removed and sputtering occurs between the target and the substrate.

During the sputtering process, the effect of magnetic fields having components perpendicular to the planes of the substrate and the target was tested. It was found that the magnetic field will change the deposition rate somewhat by making the plasma more dense, but will not have a substantial impact on the magnetic properties of the deposited films.

These sputtered films can be adjusted to provide good films for beam addressable file applications. For instance, Gd-Co films having 78 atomic percent Co had a square B-H loop, $H_c$=170 Oe (measured at room temperature) and good Faraday rotation.

SPUTTERING DATA

| Target | Film | RF Power (watts) or DC Current (ma) | Anode-Cathode Voltage | Bias Voltage | Initial Pressure ×10⁻⁸(Torr) | Operating Pressure ($\mu$) | Cathode Diameter (in.) | Deposit. Time (min.) | Sub. Temp. (C°) | RF Power Density (watts/in²) or DC Current Density (ma/in²) |
|---|---|---|---|---|---|---|---|---|---|---|
| GdCo₅ | Gd-Co 47 | 200 | 0 | 0 | 7.8 | 25 | 3 | 25 | 20 | 28 |
| | Gd-Co 52 | 200 | 0 | 0 | 8.0 | 21 | 3 | 24 | 20 | 28 |
| | Gd-Co 54 | 200 | 0 | 35 | 9.0 | 22 | 3 | 30 | 20 | 28 |
| | Gd-Co 56 | 200 | 0 | 100 | 14 | 24 | 3 | 45 | 20 | 28 |
| | Gd-Co 62 | 45 | 2000 | 50 | 10 | 81 | 3 | 25 | 20 | 6 |
| | Gd-Co 63 | 110 | 2000 | 50 | 5.6 | 68 | 4 | 35 | 20 | 9 |
| | Gd-Co 67 | 69 | 2000 | 50 | 11 | 67 | 4 | 37 | 20 | 5 |
| | Gd-Co 69 | 60 | 2000 | 50 | 5.6 | 72 | 4 | 170 | 20 | 5 |
| | Gd-Co 70 | 42 | 2000 | 25 | 14 | 66 | 4 | 30 | 20 | 3 |
| | Gd-Co 71 | 65 | 2000 | 75 | 30 | 54 | 4 | 20 | 20 | 5 |
| | Gd-Co 73 | 90 | 2000 | 100 | 11 | 64 | 4 | 20 | 20 | 7 |
| | Gd-Co 74 | 115 | 2000 | 150 | 8.7 | 71 | 4 | 15 | 20 | 9 |
| | Gd-Co 76 | 350 | 0 | 0 | 6.8 | 25 | 4 | 25 | 20 | 28 |
| GdCo₂ | Gd-Co 91 | 200 | 0 | 100 | 13 | 22 | 4 | 30 | 20 | 16 |
| | Gd-Co 95 | 200 | 0 | 100 | 5.6 | 20 | 4 | 60 | 20 | 16 |
| | Gd-Co 96 | 200 | 0 | 85 | 3.2 | 19 | 4 | 140 | 20 | 16 |
| GdFe₄ | Gd-Fe 1 | 200 | 0 | 0 | 7.1 | 19 | 4 | 30 | 20 | 16 |
| | Gd-Fe 2 | 200 | 0 | 0 | 6.6 | 17 | 4 | 30 | 20 | 16 |
| | Gd-Fe 4 | 45 | 2000 | 50 | 6.3 | 79 | 4 | 42 | 20 | 4 |

FILM DATA

| Film | Atomic Ratio Co/Gd | $4\pi M_s$(Oe) | Thickness(A) | Resistance ohms/sq. | Zero Field Strip Width ($\mu$) | Charact. length l($\mu$m) | Deposition Rate (A/sec) | Anisotropy |
|---|---|---|---|---|---|---|---|---|
| Gd-Co 47 | 6.53 | 4900 | 5263 | | | 0.1 | 3.51 | normal to plane, small amt. parallel plane |
| Gd-Co 52 | 5.52 | | 8471 | | | | 5.88 | in plane |
| Gd-Co 54 | 5.94 | | 9000 | | | | 5.00 | |
| Gd-Co 56 | 10.04 | 8000 | 3500 | | | | 1.30 | in plane |
| Gd-Co 62 | 4.54 | | 7964 | | 0.75 | 0.08 | 5.31 | normal to plane, 1% N₂ |
| Gd-Co 63 | 3.68 | 3500 | 16580 | | 4 | 0.53 | 7.90 | normal to plane |
| Gd-Co 67 | 4.17 | | 15530 | | 2.5 | 0.33 | 7.00 | '' |
| Gd-Co 69 | | 426 | 70000 | | 5 | 0.49 | 6.90 | '' |
| Gd-Co 70 | 4.74 | | 8195 | 6.9300 | 0.80 | 0.09 | 4.55 | '' |
| Gd-Co 71 | 4.96 | | 7853 | 1.5500 | | | 6.54 | in plane |
| Gd-Co 73 | 5.67 | | 12000 | 1.2000 | 1.8 | 0.24 | 10.00 | normal to plane |
| Gd-Co 74 | 6.53 | 4800 | 8400 | 1.6000 | 1.6 | 0.21 | 9.33 | normal to plane/ in plane |
| Gd-Co 76 | 5.18 | 3800 | 12380 | 0.9760 | | | 8.25 | in plane |
| Gd-Co 91 | 3.34 | | 5546 | | 1.0 | 0.128 | 3.08 | |
| Gd-Co 92 | 1.78 | | 6110 | | 10.0 | 1.30 | 1.70 | |
| Gd-Co 96 | 3.0 | | 28400 | | 2.2 | 0.20 | 3.38 | |
| Gd-Fe 1 | | | 10860 | | 1.0 | 0.11 | 6.03 | |
| Gd-Fe 2 | | | 5140 | | 0.83 | 0.105 | 2.86 | |
| Gd-Fe 4 | | | 12058 | | 1.7 | 0.211 | 4.78 | |

DETAILED SPUTTERING CONDITIONS (GdCo₅ TARGET)

| | | Presputter | Sputter Clean | Sputter |
|---|---|---|---|---|
| Gd-Co 47 (substrates were Al₂O₃, SiO₂) | Incident Watts (RF) | 100 | 350 | 200 |
| | Reflected Watts | 2 | 2 | 2 |
| | Cathode Voltage | — | — | — |
| | Bias Voltage | 0 | 120 | 75 |
| | Initial Pressure Chamber (×10⁻⁸ Torr) | 7.8 | — | 7.8 |
| | Initial Pressure Stack (×10⁻⁸ Torr) | 5 | — | — |
| | Chamber Pressure ($\mu$) Argon | 25 | 22 | 25 |
| | Cathode Diameter (in.) | 3 | 3 | 3 |
| | Time (Min) | 30 | 10 | 25 |
| | Temperature (°C) | 20 | 20 | 20 |
| Gd-Co 52 (substrates were SiO₂) | Incident Watts (RF) | 100 | 350 | 200 |
| | Reflected Watts | 2 | 2 | 2 |
| | Cathode Voltage | — | — | — |
| | Bias Voltage | 0 | 120 | 0 |
| | Initial Pressure Chamber (×10⁻⁸ Torr) | 8 | — | 8 |
| | Initial Pressure Stack (×10⁻⁸ Torr) | 5 | — | — |
| | Chamber Pressure ($\mu$) Argon | 23 | 21 | 21 |
| | Cathode Diameter (in.) | 3 | 3 | 3 |
| | Time (Min) | 60 | 10 | 24 |
| | Temperature (°C) | 20 | 20 | 20 |
| Gd-Co 54 | Incident Watts (RF) | 100 | 350 | 200 |

DETAILED SPUTTERING CONDITIONS ($GdCo_5$ TARGET)-continued

| | | Presputter | Sputter Clean | Sputter | |
|---|---|---|---|---|---|
| (substrates were $SiO_2$) | Reflected Watts | 2 | 2 | 0 | |
| | Cathode Voltage | — | — | — | |
| | Bias Voltage | 0 | 120 | 35 | |
| | Initial Pressure Chamber ($\times 10^{-8}$ Torr) | — | — | — | |
| | Initial Pressure Stack ($\times 10^{-8}$ Torr) | — | — | — | |
| | Chamber Pressure ($\mu$) Argon | 23 | 22 | 22 | |
| | Cathode Diameter (in.) | 3 | 3 | 3 | |
| | Time (Min) | 60 | 4 | 30 | |
| | Temperature (°C) | 20 | 20 | 20 | |
| Gd-Co 56 | Incident Watts (RF) | 100 | 350 | 200 | |
| (substrates were $SiO_2$) | Reflected Watts | 2 | 2 | 2 | |
| | Cathode Voltage | — | — | — | |
| | Bias Voltage | 0 | 120 | 100 | |
| | Initial Pressure Chamber ($\times 10^{-8}$ Torr) | 14 | — | — | |
| | Initial Pressure Stack ($\times 10^{-8}$ Torr) | — | — | — | |
| | Chamber Pressure ($\mu$) Argon | 25 | 24 | 24 | |
| | Cathode Diameter (in.) | 3 | 3 | 3 | |
| | Time (Min) | 60 | 10 | 45 | |
| | Temperature (°C) | 20 | 20 | 20 | |
| Gd-Co 62 | Current (ma) DC | 30 | — | 45 | |
| (substrates were $SiO_2$) 1% $N_2$ added | Reflected Watts | — | — | — | |
| | Cathode Voltage | 2000 | — | 2000 | |
| | Bias Voltage | 0 | — | 50 | |
| | Initial Pressure Chamber ($\times 10^{-8}$ Torr) | 10 | — | 10 | |
| | Initial Pressure Stack ($\times 10^{-8}$ Torr) | — | — | — | |
| | Chamber Pressure ($\mu$) Argon | 81 | — | 81 | |
| | Cathode Diameter (in.) | 3 | — | 3 | |
| | Time (Min) | 5 | — | 25 | |
| | Temperature (°C) | 20 | — | 20 | |
| Gd-Co 63 | DC Current (ma) | 50 | — | 110 | on cathode |
| (substrates were $Al_2O_3$, $SiO_2$) | | | | 108 | on anode |
| | Reflected Watts | — | — | — | |
| | Cathode Voltage | 2000 | — | 2000 | |
| | Bias Voltage | 0 | — | 50 | |
| | Initial Pressure Chamber ($\times 10^{-8}$ Torr) | 5.6 | — | 5.6 | |
| | Initial Pressure Stack ($\times 10^{-8}$ Torr) | — | — | — | |
| | Chamber Pressure ($\mu$) Argon | 70 | — | 68 | |
| | Cathode Diameter (in.) | 4 | — | 4 | |
| | Time (Min) | 35 | — | 35 | |
| | Temperature (°C) | 20 | — | 20 | |
| Gd-Co 67 | DC Current (ma) | 55 | — | 69 | on cathode |
| (substrates were $Al_2O_3$, $SiO_2$) | | | | 73 | on anode |
| | Reflected Watts | — | — | — | |
| | Cathode Voltage | 2000 | — | 2000 | |
| | Bias Voltage | 0 | — | 50 | |
| | Initial Pressure Chamber ($\times 10^{-8}$ Torr) | 11 | — | 11 | |
| | Initial Pressure Stack ($\times 10^{-8}$ Torr) | — | — | — | |
| | Chamber Pressure ($\mu$) Argon | 91 | — | 67 | |
| | Cathode Diameter (in.) | 4 | — | 4 | |
| | Time (Min) | 60 | — | 37 | |
| | Temperature (°C) | 20 | — | 20 | |
| Gd-Co 69 | Current (ma) DC | 60 | — | 60 | on cathode |
| (substrates were $Al_2O_3$, $SiO_2$) | | | | 67 | on anode |
| | Reflected Watts | — | — | — | |
| | Cathode Voltage | 2000 | — | 2000 | |
| | Bias Voltage | 0 | — | 50 | (grounded first 20 sec) |
| | Initial Pressure Chamber ($\times 10^{-8}$ Torr) | 9.3 and 5.6 | — | 5.6 | |
| | Initial Pressure Stack ($\times 10^{-8}$ Torr) | — | — | — | |
| | Chamber Pressure ($\mu$) Argon | 110 | — | 72 | |
| | Cathode Diameter (in.) | 4 | — | 4 | |
| | Time (Min) | 60 | — | 170 | |
| | Temperature (°C) | 20 | — | 20 | |
| Gd-Co 70 | Current (ma) DC | 60 | — | 42 | on cathode |
| (substrates were $SiO_2$, $Al_2O_3$) | | | | 35 | on anode |
| | Reflected Watts | — | — | — | |
| | Cathode Voltage | 2000 | — | 2000 | |
| | Bias Voltage | 0 | — | 25 | |
| | Initial Pressure Chamber ($\times 10^{-8}$ Torr) | 14 | — | 14 | |
| | Initial Pressure Stack ($\times 10^{-8}$ Torr) | — | — | — | |
| | Chamber Pressure ($\mu$) Argon | 110 | — | 66 | |
| | Cathode Diameter (in.) | 4 | — | 4 | |
| | Time (Min) | 30 | — | 30 | |
| | Temperature (°C) | 20 | — | 20 | |
| Gd-Co 71 | DC Current (ma) | 60 | — | 65 | |
| (substrates were $SiO_2$, sapphire) | Reflected Watts | — | — | — | |
| | Cathode Voltage | 2000 | — | 2000 | |
| | Bias Voltage | 0 | — | 75 | |
| | Initial Pressure Chamber ($\times 10^{-8}$ Torr) | 30 | — | — | |
| | Initial Pressure Stack ($\times 10^{-8}$ Torr) | 20 | — | — | |
| | Chamber Pressure ($\mu$) Argon | 120 | — | 54 | |
| | Cathode Diameter (in.) | 4 | — | 4 | |
| | Time (Min) | 30 | — | 20 | |
| | Temperature (°C) | 20 | — | 20 | |

DETAILED SPUTTERING CONDITIONS (GdCo₅ TARGET)-continued

| | | Presputter | Sputter Clean | Sputter | |
|---|---|---|---|---|---|
| Gd-Co 73 (substrates were quartz, Al₂O₃) | DC Current (ma) | 80 | — | 90 | on cathode |
| | | | | 106 | on anode |
| | Reflected Watts | — | — | — | |
| | Cathode Voltage | 2000 | — | 2000 | |
| | Bias Voltage | 0 | — | 100 | |
| | Initial Pressure Chamber (×10⁻⁸ Torr) | 11 | — | 11 | |
| | Initial Pressure Stack (×10⁻⁸ Torr) | — | — | — | |
| | Chamber Pressure ($\mu$) Argon | 110 | — | 64 | |
| | Cathode Diameter (in.) | 4 | — | 4 | |
| | Time (Min) | 70 | — | 20 | |
| | Temperature (°C) | 20 | — | 20 | |
| Gd-Co 74 (substrates were SiO₂) | Current (ma) DC | 80 | — | 115 | on cathode |
| | | | | 155 | on anode |
| | Reflected Watts | — | — | — | |
| | Cathode Voltage | 2000 | — | 2000 | |
| | Bias Voltage | 0 | — | 150 | |
| | Initial Pressure Chamber (×10⁻⁸ Torr) | 8.7 | — | 8.7 | |
| | Initial Pressure Stack (×19⁻⁸ Torr) | — | — | — | |
| | Chamber Pressure ($\mu$) Argon | 110 | — | 71 | |
| | Cathode Diameter (in.) | 4 | — | 4 | |
| | Time (Min) | 60 | — | 15 | |
| | Temperature (°C) | 20 | — | 20 | |
| Gd-Co 76 (substrates were quartz, Al₂O₃) | Incident Watts (RF) | 100 | 350 | 350 | |
| | Reflected Watts | 2 | 2 | 2 | |
| | Cathode voltage | — | — | — | |
| | Bias Voltage | 0 | 120 | 0 | |
| | Initial Pressure Chamber (×10⁻⁸ Torr) | 6.8 | — | 6.8 | |
| | Initial Pressure Stack (×10⁻⁸ Torr) | — | — | — | |
| | Chamber Pressure ($\mu$) Argon | 24 | 24 | 25 | |
| | Cathode Diameter (in.) | 4 | 4 | 4 | |
| | Time (Min) | 30 | 10 | 25 | |
| | Temperature (°C) | 20 | 20 | 20 | |

SUMMARY

What has been described is a new beam addressable storage system having significant advantages. An amorphous magnetic film having uniaxial anisotropy is used which has not heretofore been discovered. This film has applications in any beam addressable environment and its properties can be tailored over wide ranges to provide the desired performance level.

What is claimed is:

1. A magnetic system, comprising;
   a magnetic medium exhibiting an amorphous structure without long range atomic ordering, said medium having long range magnetic ordering and a perpendicular magnetic uniaxial anisotropy which is not due to long range atomic ordering and crystalline structure,
   writing means for changing the magnetic state of said amorphous medium,
   said writing means being comprised of beam generating means for directing electromagnetic energy at said amorphous magnetic medium and magnetic field producing means for providing a magnetic field in said amorphous medium, and
   reading means for detecting the magnetic state of said amorphous medium.

2. The system of claim 1, where said amorphous medium has microcrystalline structure with atomic ordering over distances about 25–100 angstroms.

3. The system of claim 1, where said amorphous medium is substantially amorphous having atomic ordering over distances about 25 angstroms and less.

4. The system of claim 1, where said magnetic medium is comprised of an element exhibiting a magnetic moment in at least one state thereof.

5. The system of claim 4, where said element is one selected from the group consisting essentially of 3d, 4f, and 5f elements of the periodic table.

6. The system of claim 1, where said magnetic medium is comprised of a multi-component system where at least one of said components exhibits an unpaired electron spin, the magnetic medium having a net magnetic moment.

7. The system of claim 6, where said multicomponent system is a binary alloy.

8. The system of claim 7, where said binary alloy is comprised of a rare earth element and a transition metal element.

9. The system of claim 8, where said binary alloy contains an additive element which couples antiferromagnetically with said at least one component in said alloy.

10. The system of claim 8, where said binary alloy contains an additive element which couples ferromagnetically with said at least one component in said alloy.

11. The system of claim 8, where said binary alloy includes at least one element selected from the group consisting essentially of O, N, C, and P.

12. The system of claim 8, where said binary alloy is comprised of Gd-Co.

13. The system of claim 8, where said binary alloy is comprised of Gd-Fe.

14. The system of claim 8, where said binary alloy is selected from the group consisting essentially of, Tb-Co, Ho-Fe, and Dy-Co.

15. The system of claim 1, where said beam is a light beam.

16. The system of claim 1, where said beam is an electron beam.

17. The system of claim 1, where said beam has sufficient energy to heat said magnetic medium to a temperature substantially close to its magnetic compensation point.

18. The system of claim 1, where said bean has sufficient energy to heat said magnetic medium to a temperature substantially close to its Curie point.

19. The system of claim 1, where said beam generating means includes a light source for providing a polarized light beam and said reading means includes an analyzer set to pass said light in accordance with the polarization of said beam as determined by said amorphous magnetic medium, and a detector responsive to the intensity of light reaching it after passage through said analyzer.

20. The system of claim 1, where said anisotropy is in a direction substantially perpendicular to the plane of said amorphous magnetic medium.

21. A beam addressable system, comprising:
a magnetic layer located on a substrate, said layer having conduction electrons therein and exhibiting substantially amorphous structure having no long range atomic ordering and having long range magnetic ordering and a perpendicular magnetic uniaxial anisotropy which is not due to long range atomic ordering and crystalline structure,
beam producing means for generating a beam of electromagnetic energy directed at desired locations of said film for heating said film at said desired locations,
magnetic field producing means for providing a magnetic field in said storage medium for changing the magnetic state of said storage medium at said desired locations,
reading means for detecting a beam of electromagnetic energy after it has struck said storage medium at said desired location for determining the magnetic state of said storage medium at said locations.

22. The system of claim 21, where said reading means is comprised of an analyzer for selective passage of said beam used for reading in accordance with its polarization state, and a detector for providing a signal in accordance with the intensity of said beam which strikes said detector after passage through said analyzer.

23. The system of claim 21, where said magnetic layer has uniaxial anisotropy perpendicular to the plane of said layer.

24. The system of claim 21, where said substrate is a rigid medium.

25. A magnetic storage system, comprising:
a storage medium located on a substrate, said storage medium being a magnetic material exhibiting an amorphous structure without long range atomic ordering, and having long range magnetic ordering and a perpendicular magnetic uniaxial anisotropy which is not due to crystalline structure and long range atomic ordering.
writing means for changing the magnetic state of a plurality of selected portions of said storage medium, said writing means including:
heating means for locally heating selected areas of said storage medium,
magnetic field producing means for providing a magnetic field at said selected areas for altering the magnetic state of said storage medium at said selected areas,
reading means for detecting the magnetic state of said selected areas of said storage medium, said reading means including:
light means for directing a polarized light beam onto said selected areas of said storage medium to cause polarization rotation of said light beam in accordance with the magnetic state of said storage medium at said selected areas, and
detection means responsive to the degree of rotation of said light beam polarization.

26. The system of claim 25, where said heating means is comprised of a beam producing means for directing a beam of electromagnetic energy onto said storage medium.

27. The system of claim 26, where said electromagnetic beam is a light beam.

28. The system of claim 26, where said beam producing means is a laser.

29. The system of claim 25, including means for moving said storage medium.

30. The system of claim 25, where said heating means is comprised of a light source for directing a light beam onto said storage medium.

31. The system of claim 29, where said light source also provides said polarized light beam used for reading.

32. The system of claim 25, where said amorphous medium is located on a conducting substrate.

33. The system of claim 25, where said amorphous medium is located on an insulating substrate.

34. The system of claim 25, where said amorphous medium is comprised of a rare earth — transition metal alloy.

35. The system of claim 34, further including additional elements in said rare earth — transition metal alloy.

36. In a storage system comprising a storage medium onto which is incident an electromagnetic beam used to write a plurality of bits of information into the storage medium or to read the information associated with the bits stored in the storage film, the improvement being a magnetic storage medium exhibiting no long range atomic ordering and which exhibits long range magnetic ordering where said storage medium has a perpendicular uniaxial magnetic anisotropy which is not due to crystalline structure and long range atomic ordering.

37. The magnetic system of claim 36, where said storage medium is comprised of a rare earth element and a transition metal element.

38. In a storage system including a storage medium onto which is incident an electromagentic beam used to either write a plurality of bits of information into said storage medium or to read the information state of said bits of information in said storage medium, the improvement being a storage medium characterized by an amorphous atomic structure where said storage medium has long range magnetic ordering and a growth induced uniaxial anisotropy due to pair ordering in the storage medium.

39. In a storage system including a storage medium onto which is incident an electromagnetic beam that is used to either write a plurality of bits of information into said storage medium or to read the information state of said bits in said storage medium, the improvement being a magnetic storage medium having an amorphous atomic structure and long range magnetic ordering, said amorphous magnetic medium having a shape-induced perpendicular uniaxial magnetic anisotropy which is not due to crystalline structure and long range atomic ordering.

* * * * *